(12) United States Patent
Santangelo et al.

(10) Patent No.: US 9,230,720 B2
(45) Date of Patent: Jan. 5, 2016

(54) ELECTRICALLY TRIMMABLE RESISTOR DEVICE AND TRIMMING METHOD THEREOF

(71) Applicant: STMicroelectronics S.r.l., Agrate Brianza (IT)

(72) Inventors: Antonello Santangelo, Belpasso (IT); Stefania Maria Serena Privitera, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 204 days.

(21) Appl. No.: 13/924,159

(22) Filed: Jun. 21, 2013

(65) Prior Publication Data

US 2013/0342264 A1     Dec. 26, 2013

(30) Foreign Application Priority Data

Jun. 22, 2012   (IT) ............... TO2012A0553

(51) Int. Cl.
| | |
|---|---|
| *H03L 5/00* | (2006.01) |
| *H01C 10/50* | (2006.01) |
| *H01C 17/232* | (2006.01) |
| *H01C 17/26* | (2006.01) |
| *H01L 49/02* | (2006.01) |
| *H01L 23/522* | (2006.01) |
| *H01L 21/66* | (2006.01) |

(52) U.S. Cl.
CPC .............. *H01C 10/50* (2013.01); *H01C 17/232* (2013.01); *H01C 17/265* (2013.01); *H01L 22/20* (2013.01); *H01L 23/5228* (2013.01); *H01L 28/20* (2013.01); *H01L 22/14* (2013.01); *H01L 2924/0002* (2013.01)

(58) Field of Classification Search
CPC ..... H01C 10/50; H01C 17/232; H01C 17/265
USPC ........................................................ 327/308
See application file for complete search history.

(56) References Cited

U.S. PATENT DOCUMENTS

| | | | |
|---|---|---|---|
| 4,210,996 A | 7/1980 | Amemiya et al. | |
| 4,870,472 A | 9/1989 | Vyne | |
| 5,466,484 A | 11/1995 | Spraggins et al. | |
| 5,563,519 A * | 10/1996 | Honkanen ..................... | 324/676 |
| 5,587,097 A | 12/1996 | Sato et al. | |
| 5,635,893 A | 6/1997 | Spraggins et al. | |

(Continued)

FOREIGN PATENT DOCUMENTS

| | | |
|---|---|---|
| EP | 0033155 A1 | 8/1981 |
| GB | 1357873 | 6/1974 |

*Primary Examiner* — Ryan Jager
(74) *Attorney, Agent, or Firm* — Seed IP Law Group PLLC

(57) ABSTRACT

An integrated circuit has a circuit part and a trimmable resistor, the resistance whereof may be modified by Joule effect. The trimmable resistor has first and second connection terminals coupled to the circuit part, and an intermediate terminal that divides the trimmable resistor into two portions. The first and the second connection terminals and the intermediate terminal are coupled to respective pads configured to receive electrical quantities designed to cause, in use, a respective trimming current flow in each portion. In this way, a substantially zero voltage drop is maintained between the first and second connection terminals while current is flowing in the resistor to change an electrical characteristic of the resistor, such as resistance or thermal coefficient.

30 Claims, 3 Drawing Sheets

(56) References Cited

U.S. PATENT DOCUMENTS

| | | |
|---|---|---|
| 5,679,275 A | 10/1997 | Spraggins et al. |
| 5,757,264 A | 5/1998 | Petit |
| 5,808,197 A | 9/1998 | Dao |
| 6,097,276 A | 8/2000 | Van Den Broek et al. |
| 6,326,256 B1 | 12/2001 | Bailey et al. |
| 6,737,877 B1 * | 5/2004 | Hatton et al. ............... 324/723 |
| 6,960,744 B2 | 11/2005 | Adkisson et al. |
| 7,249,409 B2 | 7/2007 | Landsberger et al. |
| 7,422,972 B2 | 9/2008 | Babcock et al. |
| 8,009,011 B2 | 8/2011 | Molin et al. |
| 8,577,316 B2 * | 11/2013 | Henson et al. ............. 455/179.1 |
| 2007/0273444 A1 * | 11/2007 | Bajdechi et al. ............. 330/260 |
| 2009/0022034 A1 * | 1/2009 | Takei et al. ............... 369/112.01 |
| 2012/0001679 A1 * | 1/2012 | Privitera et al. ............... 327/524 |
| 2012/0171838 A1 | 7/2012 | Privitera |
| 2013/0342264 A1 * | 12/2013 | Santangelo et al. .......... 327/524 |

* cited by examiner

ELECTRICALLY TRIMMABLE RESISTOR DEVICE AND TRIMMING METHOD THEREOF

BACKGROUND

1. Technical Field

The present disclosure relates to an electrically trimmable resistor device and to the trimming method thereof.

2. Description of the Related Art

As is known, in many integrated circuits, some quantities of the integrated circuit are modified since, at the end of the manufacturing processes and because of the tolerances of its components, the function of the integrated electronic device is impaired or other than optimal. Such modifications are, for example, particularly beneficial in applications that employ a high precision in the performed functions.

For example, the need for precise regulation of biasing quantities is particularly felt in devices generating high-precision reference voltages that use supply voltages variable within a rather wide range of values.

This type of devices is used to generate, starting from the variable supply voltage, a voltage that is very precise and stable over time and that is largely unaffected by the changes in environmental temperature or in the manufacturing processes.

Even though some circuit configurations enable more or less effective compensation of temperature and input voltage changes, the final integrated circuit is unlikely to present, at the end of the production cycle, the desired voltage value. Therefore, currently it is common to intervene on some circuit components, modifying the values thereof, through a postproduction process, i.e., at the level of finished silicon wafer or, preferably, at the end of the assembly process. The assembly process, in fact, due to the involved thermal processes and the mechanical actions induced on the die by thermal expansion of the involved various materials, produces changes in the electrical circuit parameters, which can be compensated only after assembly.

Another example of devices where post-production modification is common is in devices having an offset. For example, in newly manufactured precision operational amplifiers, offset voltage that is typically present at the output is corrected.

The modulation and trimming of the electrical function performed by the integrated device may be obtained by modifying, for example, the value of one or more resistances of the circuit, selected so as to have the greatest impact on the electrical function to be performed and so as to be able to compensate the most common process imperfections.

In a prior solution (see, for example, U.S. Pat. No. 6,326, 256), the resistance of a resistor is modified by making an incision on its surface, which is generally of metal. To this end, a laser beam performs the incision orthogonally and in the direction of the flow of current. The cut, which involves the entire thickness of the resistor, is made while controlling the electrical parameter that it is desired to modulate.

This procedure may be performed, for each single device, in the final manufacturing step of the wafer and in particular during EWS (Electrical Wafer Sorting). However, since the device is provided with a window transparent to laser light, it is problematical to apply the technique to devices closed within a package, since the latter, in general, is opaque to radiation. In addition, the costs for purchase and use of a machine dedicated to laser trimming may be rather high, and the trimming process may be time intensive.

Other techniques (see, for example, U.S. Pat. Nos. 5,757, 264 and 7,422,972) envisage, for example, the use of a number of resistors that are selected through "anti-fuse" or "fuse" devices. Frequently, these techniques employ operations that may be electrically performed using appropriate pins of the assembled integrated circuit, and have as a main drawback the fact that the final value of the resistance can assume only discrete values. In addition, the resistance can be modulated only through discrete values, and any improvement of precision entails the addition of resistors, with consequent high occupation of area on silicon.

U.S. Pat. No. 8,009,011 describes a substantially alternative technique, which exploits changes in some physical properties of certain conductive materials, such as, for example, doped polysilicon or metal materials when these are subject to a thermal treatment.

Local heating of the resistive element can be, for example, performed by arranging close to it an electrical heating element that permanently induces the desired resistivity changes (see, for example, U.S. Pat. Nos. 5,635,893, 5,587,097, 6,960, 744, 5,679,275, 5,466,484, and 7,249,409).

The problem of the above solution lies in the technical complexity of production linked to the provision of a heating element that is electrically insulated from, but in intimate thermal contact with, the resistive element to be modified, since the temperatures generated during the trimming phase may even exceed 500° C.

Alternatively, it has been proposed to heat the material of the resistor by self-heating (see, for example, U.S. Pat. Nos. 4,210,996, 4,870,472 and 5,808,197). To this end, an appropriate current pulse is supplied to the resistor so that it heats by Joule effect. The current is controlled so as to introduce a change in the physical properties of the material corresponding to the desired value of resistance.

It has also been proposed (U.S. Pat. No. 4,870,472) to modify the circuit, adding, for example, active components so as to protect electrical functionality of the other components during resistor trimming, but this technique does not have general validity and in some cases is not applicable.

A known solution (U.S. Application Publication No. 2012/ 0001679) consists in providing a trimming resistor arranged transversely to the functional resistor to be calibrated and flowed by a current that causes heating and resistivity change of the cross-over area.

This solution avoids the need to apply a potential difference across the two terminals of the functional resistor, but, in fact, enables heating only of a small portion of the functional resistor. In the case of resistances of a high value, i.e., when the length of the resistor R is particularly extensive, this solution may introduce only minor changes in the final value, which may not be sufficient.

BRIEF SUMMARY

One embodiment of the present disclosure is a resistor device that overcomes the drawbacks of the prior art.

According to an embodiment, an electrically trimmable resistor device and the corresponding method are provided.

In practice, the resistor that may undergo trimming is divided into two parts coupled at a central contact having the sole purpose of enabling trimming of the resistance. By appropriately biasing the central contact and setting the other two terminals the resistor at the same potential, so that the potential difference across the trimmable resistor is zero, the two parts of the resistor are flowed by currents that cause a self-heating of the two parts that enables change in the physical properties, such as the resistivity, of the trimmable resistor.

BRIEF DESCRIPTION OF THE SEVERAL VIEWS OF THE DRAWINGS

Various embodiments are described, purely by way of non-limiting example, with reference to the attached drawings, wherein.

DETAILED DESCRIPTION

Figure 1:
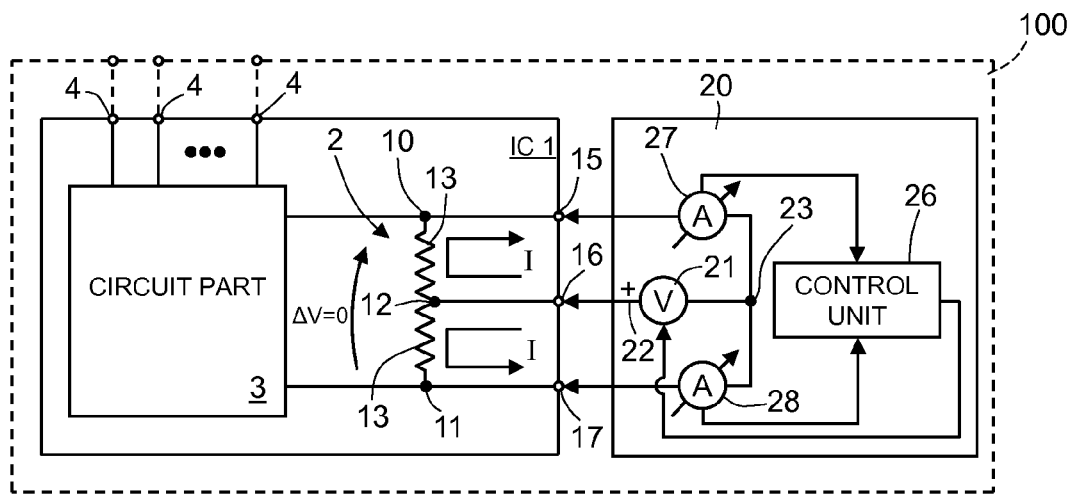
FIG. 1 is a circuit diagram of an embodiment of the present device.

Referring to the prior art solution discussed above, in which the material of a resistor is heated by applying an electrical current pulse to the resistor so that it heats by Joule effect, one of the major drawbacks of this solution lies in that, to cause a current to circulate within the resistor, a potential difference is applied across the latter. The resistor forms part, however, of an integrated circuit, i.e., of a circuit including a plurality of active and passive components that may be arranged in any of a very large number of circuit configurations, according to the application. In general, it is difficult to foresee whether the potential difference necessary for resistor trimming may induce current elsewhere in the circuit that causes permanent damage to the circuit, which may limit the possibilities of this solution. FIG. 1 shows an integrated circuit 1 including a trimmable resistor 2 and a circuit part 3. The integrated circuit 1 may be of any kind, of an analog or digital type, whether standard or customized, for performing any function, and is provided with pads 4 for external connection on the basis of the function envisaged for the integrated circuit 1.

The trimmable resistor 2 has two connection terminals 10 and 11 coupled to the circuit part 3 and with a central contact 12 so to divide the trimmable resistor 2 into two portions 13. For example, the two portions 13 may have the same shape, size (in particular, the same length and cross-section), and the same electrical properties, in particular the same resistance. Alternatively, they may differ in length, resistivity, resistance, and other characteristics. In this latter case the two portions 13 of the trimmable resistor 2 are asymmetrical and undergo different heating and different trimming.

The trimmable resistor 2 is obtained so as to present electrical characteristics, in particular resistivity or temperature coefficient of resistance (TCR), that may be thermally modified, in a known manner. For example, the trimmable resistor 2 may be made by the material commonly referred to as SiCr and containing alloys of chromium boride ($CrB_2$), silicon (Si), and silicon carbide (SiC), or by alloys of nickel (Ni) and Si or tantalum nitride (TaN), or by a phase-change material, for example an alloy containing an element of group VI (chalcogenide), or by a material characterized by two phases with different resistivities (for example, in two crystalline phases), which may undergo phase transitions using an electrical pulse.

Each connection terminals 10, 11 is coupled to a respective end pad 15, 17, and the central contact 12 is coupled to a central pad 16 of the integrated circuit 1.

In the testing step, whether at a wafer level (EWS—electrical wafer sorting), at die level, or chip level, the pads 15-17 are coupled to a trimming device 20 including, in its basic structure, a voltage source 21 and a control unit 26. The voltage source 21 has a first terminal 22 coupled to the central contact 12 and a second terminal 23 coupled to the connection terminals 10, 11, which consequently are at the same potential.

In detail, in the trimming phase, the voltage source 21 generates a voltage pulse V (preferably having a duration comprised from a few microseconds up to tens of milliseconds), for example positive on the first terminal 22 with respect to the second terminal 23. In this way, the connection terminals 10, 11 are at the same potential, and the central contact 12 is biased at +V with respect to the connection terminals 10, 11. Since the connection terminals 10, 11 are at the same potential, the trimmable resistor 2 and the circuit part 3 see at their terminals a zero voltage, but the voltage across each portion 13 of the trimmable resistor 2 gives rise to two opposite currents I (i.e., both exiting the central contact 12). The result does not change if a voltage V of an opposite sign is applied, in which case both currents I would be entering the central contact 12. Consequently, the two portions 13 heat up by Joule effect, and the trimmable resistor 2 modifies its electrical characteristics, for example its resistivity or temperature coefficient or both.

In this way, irrespective of whether the portions 13 have the same initial resistance and irrespective of the position of the central contact 12, during trimming, the connection terminals 10 and 11 are short-circuited, and consequently the potential difference between them is zero, even though the currents that circulate in the two portions 13 may be different. In fact, at the end of trimming, what matters is the total resistance of the trimmable resistor, which is equal to the sum of the resistances of the two portions 13.

The trimming device 20 may further comprise electronic components designed for measuring the electrical characteristic that is to be modified and for controlling activation of the voltage source 21. For example, in FIG. 1, the trimming device 20 comprises a pair of ammeters 27, 28 each coupled between a respective each pad 15, 17 and the second terminal 23 of the voltage source 21. The ammeters 27, 28 are further coupled to the control unit 26 to supply the measurement value, while the voltage source 21 is controlled by the control unit 26 so as to be able to generate different voltage values, as explained hereinafter.

In this way, by reducing the voltage of the voltage source 21 so as to not heat the trimmable resistor 2, it is possible to measure the current exiting the pads 15 and 17. Since, further, the voltage applied on each portion 13 is known (since it is equal to the voltage generated by the voltage source 21) the control unit 26 can calculate the resistances of the two portions 13 and compute the sum thereof so as to have an indication of the total resistance of the trimmable resistor 2.

Alternatively, instead of the ammeters 27, 28, a resistance measurement stage may be provided, coupled to the control unit 26 and coupleable via switches to the connection terminals 10, 11 of the trimmable resistor 2. By providing similar switches between the second terminal 23 of the voltage source 21 and the end pads 15, 17, the control unit 26 can determine the resistance of the trimmable resistor 2, even though in this case the result could be less precise, due to the possible effect of the components in the circuit part 3. In this case, after applying the voltage V and the changing the resistance of the trimmable resistor 2, and after disconnecting the voltage source 21 from the end pads 15, 17, the control unit 26 may acquire the resistance through the resistance-measurement stage.

In either case, after measuring the resistance, the control unit 26 may control the voltage source 21 so as to apply once again the voltage V or a voltage of a different value, for a finer trimming of the resistance, with a step-by-step process.

In this way, as mentioned above, trimming of the trimmable resistor 2 may be performed in various manufacturing steps of the integrated circuit 1. When it is performed at the finished device level (integrated circuit 1 already packaged), a particular advantage is obtained since it is possible to compensate the integrated circuit 1 in a final condition, ready for marketing.

Figure 2:
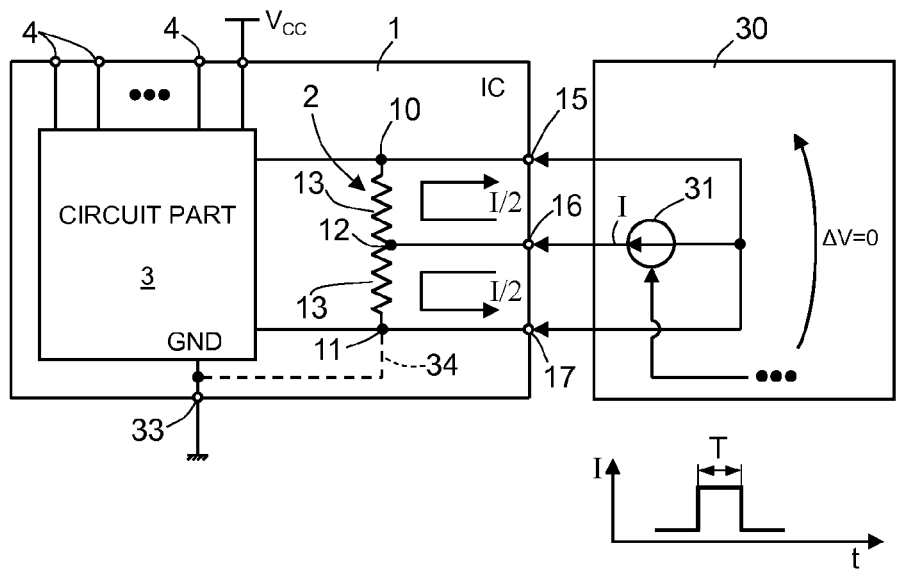
FIG. 2 is a circuit diagram of a different embodiment of the present device.

In FIG. 2, a trimming device 30 comprises a current generator 31 instead of the voltage source 21. The trimming device 30 may comprise a control unit and ammeters similar to the elements 26-28 shown in FIG. 1 or to the alternative described above. Also here, further, the control unit controls turning-on of the current generator 31.

During trimming, the current generator 31 feeds the central contact 12 with a current pulse I of duration T (as shown in the detail in FIG. 2). The current I is shared between the two portions 13, which are thus traversed by respective current pulses correlated to the corresponding resistance values, whereas the connection terminals 10, 11 of the trimmable resistor 2 see also here a voltage drop $\Delta V = 0$ V.

The current pulse I may be modulated so as to produce the desired resistance change or, at the most, a smaller change. It is thus possible, via the trimming device 30, after the first trimming and the corresponding measurement of resistance, to apply one or more successive pulses so as to refine the value by successive approximations and obtain a final value that is as close as possible to the desired value.

In general, the duration of the pulse T and its intensity I depend upon the degree of thermal insulation of the structure of the trimmable resistor 2. The lower the dissipation of the trimmable resistor 2 towards the surrounding materials, the shorter the duration or the smaller the amplitude of the pulse.

In addition, it is possible to initially study the resistance change of the trimmable resistor 2 as a function of the duration and amplitude of the pulse, for example on a first semiconductor wafer of a same batch or in an appropriate separate step. Next, the results of the trimming may be forecast to the advantage of a faster, error-free iteration.

The embodiments of FIGS. 1 and 2 enable trimming of the characteristics of the trimmable resistor 2 in a general case, when the latter is not coupled either to ground or to a supply terminal of the integrated circuit 1, and thus three pads 15-17 are purposely provided for coupling the integrated circuit 2 to the trimming device 20 or 30.

If trimming is made at a semiconductor-wafer level, the three terminals are formed by three purposely provided pads, as described above, whereas, in the case of an assembled device, three further pins are provided for biasing the single trimmable resistor 2.

Instead, if one of the two connection terminals 10, 11, for example, the connection terminal 11, is electrically coupled to ground, then just two extra connections are sufficient to adjust the trimmable resistor 2 since the ground terminal is normally already provided and may be used for the purpose.

In fact, if the pad 17 is coupled to a ground pad 33 of the integrated circuit 1, as represented by the dashed line 34, the integrated circuit 1 requires just two specifically provided pads (pads 15, 16), and the pad 17 may be absent.

In order to reduce the number of connections to be used for adjusting the trimmable resistor 2 in the general case, it is possible to use active components operating as switches and generally comprised within the integrated circuit 1.

Figure 3:
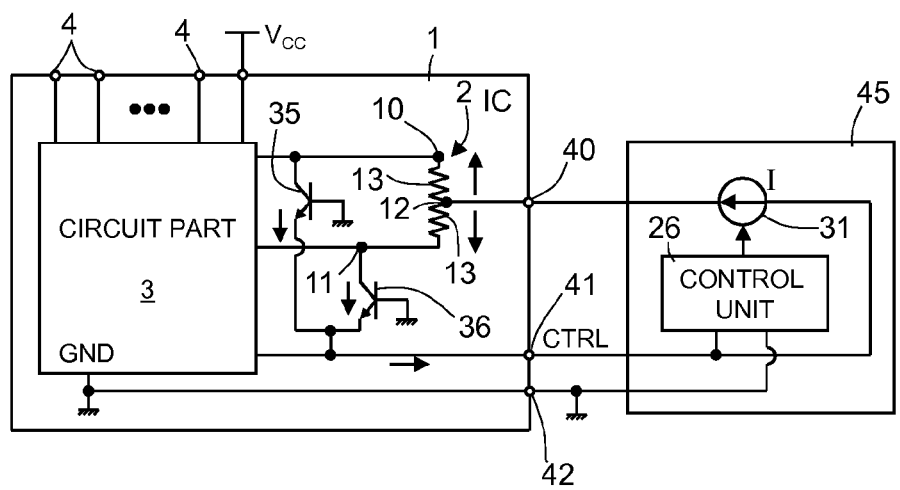
FIG. 3 shows a circuit diagram of another embodiment of the present device.

For example, FIG. 3 shows an embodiment that uses control transistors 35 and 36 of a bipolar type and precisely of an NPN type.

In detail, the integrated circuit 1 has a trimming pad 40 designed for the trimming functions. In addition, the integrated circuit 1 has a control pad 41, a ground pad 42, and generic pads 4, provided in a known way for external connection of the integrated circuit 1. The control pad 41 and ground pad 42 are already designed for operation of the integrated circuit 3 and are coupled to respective nodes of the circuit part 3.

Here, the first control transistor 35 has a collector terminal coupled to the first connection terminal 10 of the trimmable resistor 2, a base terminal coupled to ground (ground of the integrated circuit), and an emitter terminal coupled to the control pad 41. The second control transistor 36 has its collector terminal coupled to the second connection terminal 11 of the trimmable resistor 2, its base terminal coupled to ground (ground of the integrated circuit), and its emitter terminal coupled to the control pad 41.

FIG. 3 shows a trimming device 45, including a current source, designated again by reference number 31, and a control unit, designated again by reference number 26, by analogy with homologous components of FIGS. 1 and 2. The control unit 26 is here coupled to the control pad 41 and to the ground pad 42.

In use, during normal operation of the integrated circuit 1, the trimming device 45 is not coupled, and the control pad 41 and ground pad 42 are used for normal operation of the integrated circuit 1. In particular, the control pad 41 may be used as an input/output of the circuit. Consequently, the control pad 41 may assume a higher potential than the ground of the integrated circuit 1 (i.e., the ground pad 42). Consequently, the control transistors 35 and 36 are off, and the terminals 10 and 11 of the trimmable resistor 2 are insulated from the control pad 41 and ground pad 42. The device is designed so that, in normal conditions of operation of the integrated circuit 1, the breakdown voltages of the emitter-base and base-collector junctions of the two transistors 35 and 36 are higher, respectively, than the voltages on the pad 41 and on the terminals 10 and 11.

Instead, in the trimming phase, the circuit part 3 is de-activated, and the trimming device 45 is coupled to the pads 40-41, according to FIG. 3. In this condition, the control unit 26 may bring the potential on the control pad 41 below the ground potential by an amount sufficient to cause switching-on of the control transistors 35 and 36. Consequently, the connection terminals 10, 11 of the trimmable resistor 2 are coupled to each other and at a node coupled to the control pad 41. By applying current pulses generated by the current generator 31 through the trimming pad 40, it is thus possible to cause circulation of a current in the two portions 13, maintaining the potential difference between the connection terminals 10, 11 substantially at zero. Also in this case, successive current pulses may be applied after measuring the resistance, which, however, in this case results in only an indirect resistance value.

With the solution of FIG. 3 it is thus possible to perform trimming of the trimmable resistor 2 using a single additional pad (the trimming pad 40). The integrated circuit 1 of FIG. 3 consequently has a smaller area occupied by the pads, and the package may be provided with a smaller number of pins.

As an alternative to FIG. 3, the control transistors 35 and 36 may be replaced by MOSFET devices. In addition, instead of the ground pad 42, a supply pad set at Vcc may be used, replacing, for example, the control transistors 35 and 36 with bipolar transistors of a PNP type having the base terminal coupled to the supply Vcc instead of to ground so that they turn on when the control pad 41 is brought to a higher potential than the supply pad Vcc.

Figure 4:
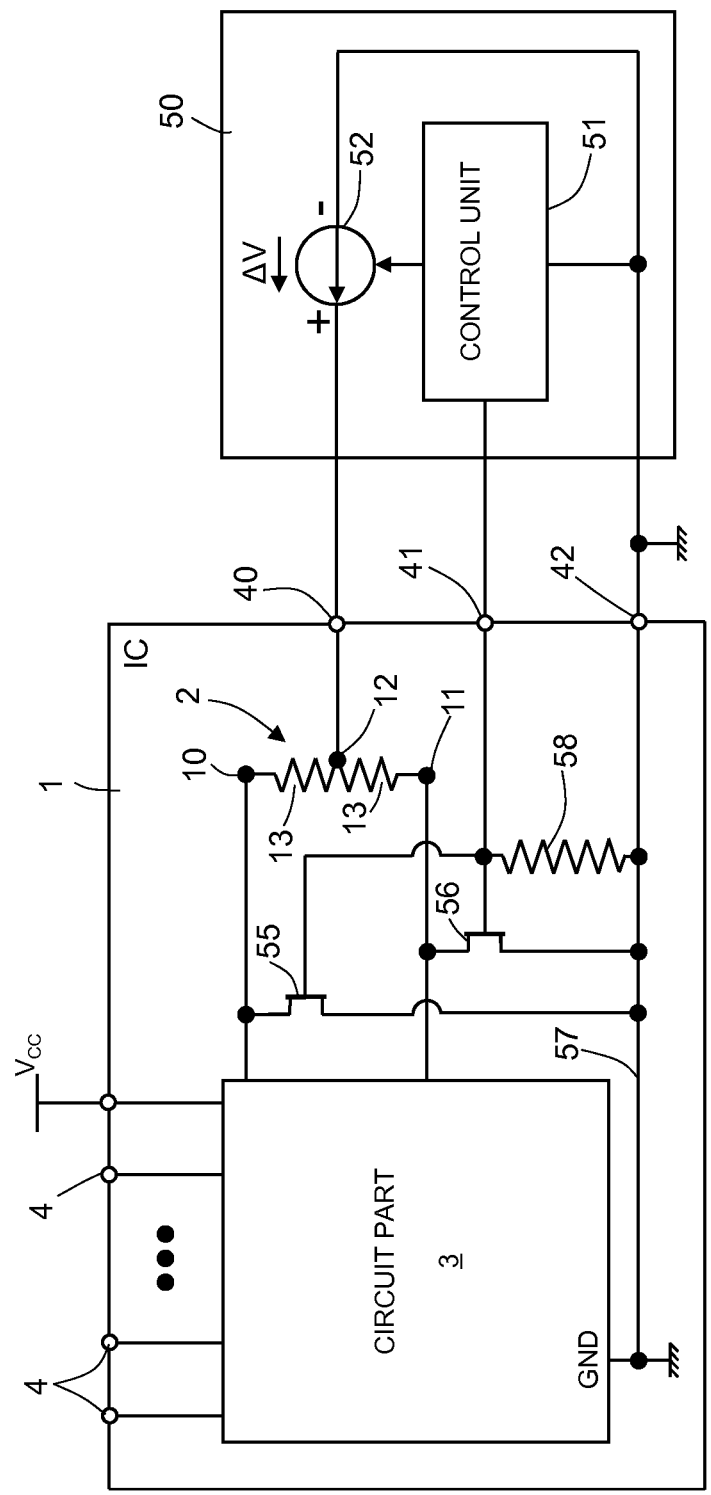
FIG. 4 shows a circuit diagram of yet a different embodiment of the present device.

In FIG. 4, the bipolar transistors 35, 36 of FIG. 3 are replaced by a first and a second MOS transistors 55, 56 coupled between a respective connection terminal 10, 11 of the trimmable resistor 2 and a ground line 57 coupled to the ground pad 42. In detail, the first MOS transistor 55 has a first conduction terminal coupled to the connection terminal 10, a second conduction terminal coupled to the ground line 57 and a control terminal coupled to a first terminal of a biasing resistor 58. The second MOS transistor 56 has a first conduction terminal coupled to the connection terminal 11, a second conduction terminal coupled to the ground line 57, and a control terminal coupled to the first terminal of the biasing resistor 58. The biasing resistor 58 has a second terminal coupled to the ground line 57. The first terminal of the biasing resistor 58 is further coupled to a control unit 51 of a trimming device 50, here including a voltage-pulse source 52. The control unit 51 is further coupled to the pad 41. In practice, the biasing resistor 58 ensures the MOS transistors 55 and 56 to be off when the trimming device 50 is decoupled and the integrated circuit 1 operates autonomously according to the its functions.

In this solution, the pad 41 performs the dual function of being a programming electrode of the trimmable resistor 2, when the circuit part 3 is not supplied and its potential drops below the ground value, whereas it performs a specific function of the integrated circuit 1, when the latter operates autonomously. In this case, the pad 41 is in general at a potential comprised between ground and Vcc.

The solution of FIG. 4 enables a step-by-step trimming that is particularly simple, since here a direct measurement of the trimmable resistor 2 is not performed but, rather, the effect of the resistance of the trimmable resistor 2 is measured on the entire integrated circuit 1, which, in fact, is the final purpose of the trimming operation.

In this case, a possible trimming procedure may take place as follows, through various discrete steps:

1) Initially, the trimming device 50 is decoupled from the integrated circuit 1, and the integrated circuit 1 is biased according to a standard procedure of the testing machine. Using an EWS-type unit (not shown), the electrical quantity to be trimmed is measured (for example, the offset voltage in an operational amplifier) and the resistance of the trimmable resistor 2 for reducing the deviation of the selected parameter is forecast by excess.

2) Next, the integrated circuit 1 is decoupled from its supply source to prevent currents generated in the circuit part 3 from flowing in the terminals 10 and 11. The trimming device 50 is coupled to the integrated circuit 1, and a first trimming operation is performed, generally insufficient to obtain the final desired value of the quantity to be modified.

3) Steps 1) and 2) are repeated a number of times so as to modify the resistance of the trimmable resistor 2, each time to a lower extent and so as to reduce more and more slowly the deviation of the quantity to be modified from the desired value. The cycle is then interrupted after the measurement of step 1) when the error with respect to the desired value is lower than a preset value.

As already described above, the control unit 51 of the trimming device 50 controls the voltage source 52 so as to cause passage of current pulses in the two portions 13. Also here, it is possible to use the supply pad Vcc instead of the ground pad 42 as described with reference to FIG. 3.

In order to minimize the duration and the amplitude of the trimming pulses, it is possible to design the trimmable resistor 2 so as to minimize the heat dispersion with the materials surrounding the trimmable resistor 2 towards the semiconductor substrate.

Figure 5:
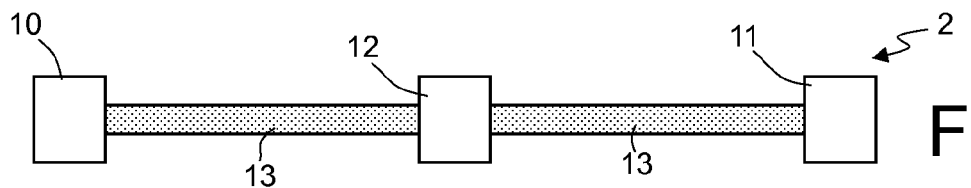
FIGS. 5-7 show different implementations of a trimmable resistor that may be used in the diagrams of FIGS. 1, 2 and 4.

For example, FIG. 5 shows a trimmable resistor 2 extending along a substantially straight line, having a central tap corresponding to the central contact 12.

Figure 6:
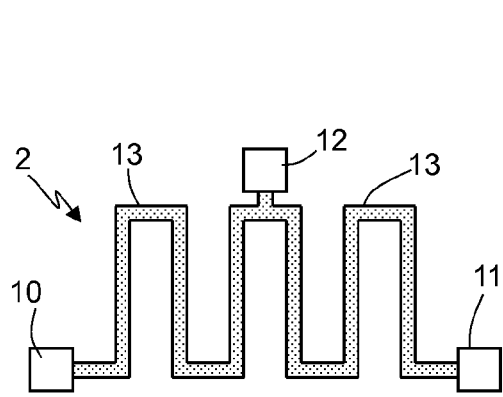
Figure 7:
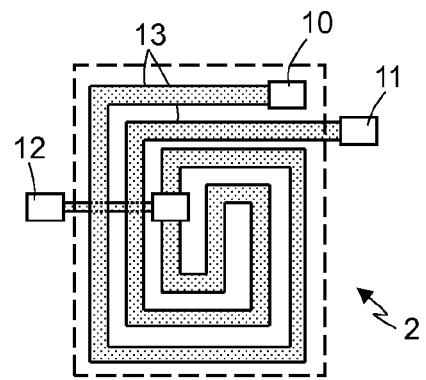

FIG. 6 shows, instead, an embodiment of the trimmable resistor 2 with a zigzag shape. FIG. 7 shows an embodiment of the trimmable resistor 2 with a spiral-like shape. The solutions of FIGS. 6 and 7 enable reduction of heat dispersion since they minimize the "thermal perimeter" of the structure (represented dashed in FIG. 7), and represent respective embodiments.

Figure 8:
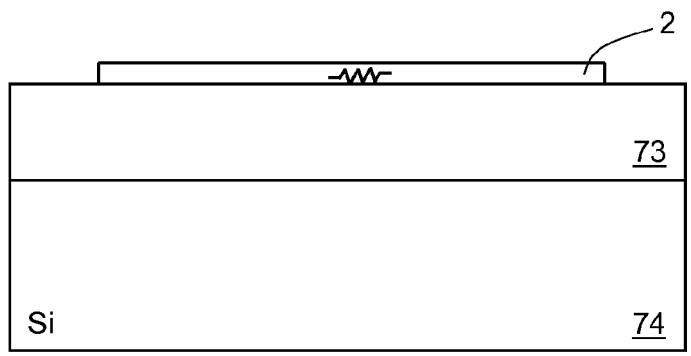
FIG. 8 shows the cross-section through a semiconductor device including the present trimmable resistor.

In order to improve further the thermal insulation of the structure, in general obtained using a thin metal film, it is useful to arrange a large thickness layer between the thin film forming the trimmable resistor 2 and an underlying semiconductor layer (housing the circuit part 3); the large thickness layer may be of oxide or materials with low thermal conductivity, such as, for example, polyamide. This embodiment is, for example, shown in FIG. 8, where the trimmable resistor 2 is a thin-film resistor and lies above a dielectric layer 73, which in turn overlies a semiconductor substrate 74.

The trimmable resistor 2 may be also made using phase-change materials. In particular, this embodiment may be used for calibrating the resistance of a resistor of the type described in U.S. Application Publication No. 2012/171838) formed by two portions electrically coupled to each other having different crystalline phases and opposite temperature coefficients. By suitably arranging the central contact so as to obtain a desired ratio between the two phases (one whereof may be trimmed in the described way and the other one not trimmed), it is possible to obtain a practically zero temperature coefficient.

Figure 9:
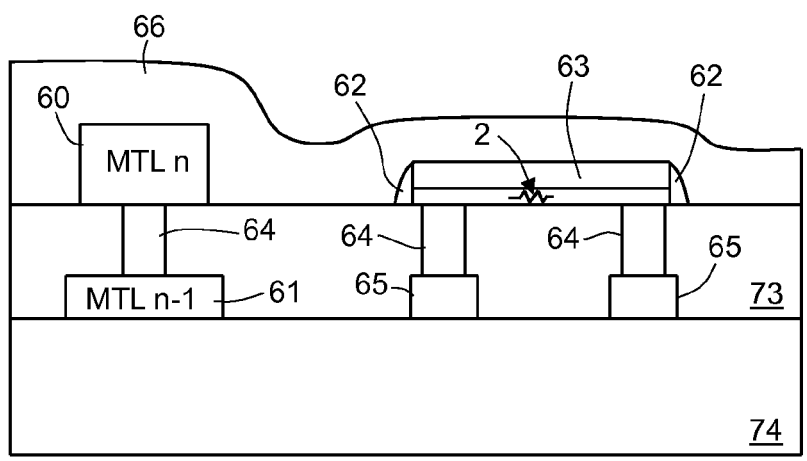
FIG. 9 shows a cross-section through a different semiconductor device including the present trimmable resistor.

FIG. 9 shows conductive regions 60, 61 made in the last and, respectively, in the last but one metallization level (MLTn, MLTn−1). Here, the trimmable resistor 2 is protected also laterally by spacer regions 62, e.g., of silicon nitride, and at the top by a further dielectric layer 63. Vias 64 connect the conductive regions 60, 61 to each other and the trimmable resistor 2 to the conductive regions 65 formed in the last but one metallization level and in turn coupled directly or indirectly to components integrated in the substrate 74. Alternatively, empty regions may be provided on the sides of the trimmable resistor 2 via dedicated etching process steps.

A passivation layer 66 covers the entire structure.

The integrated circuit 1 and the trimming system of the embodiments described above have numerous advantages. In particular, they enable a simple trimming of a resistor of the integrated circuit, without requiring substantial changes in the layout of the integrated circuit or the need to integrate adjacent heating structures or windows. Trimming may be performed irrespective of the dimensions of the trimmable resistor with a simple process.

Finally, it is clear that variations and changes may be made to the integrated circuit and to the system described and illustrated herein, without thereby departing from the scope of the present disclosure. For example, the specific structure of the trimmable resistor 2 may vary, provided that its electrical characteristics can be modified as a result of flowing currents (Joule effect).

The trimming device may be a stand-alone device or form part of a more complex testing machine, operating at the wafer or finished device level or, if the dimensions of the integrated device so allow, the trimming device may be integrated with the circuit part 3 and the trimmable resistor 2, as represented schematically in FIG. 1 by a dashed line and designated by the number 100. Other embodiments may likewise implement an integrated solution. In fact, in some conditions, a "self-trimming" may be provided, as long as, for example, the supply voltage Vcc is sufficient to cause the two portions 13 to be crossed by a sufficient current for self-heating.

The various embodiments described above can be combined to provide further embodiments. All of the U.S. patents, the U.S. patent application publications referred to in this specification are incorporated herein by reference, in their entirety. Aspects of the embodiments can be modified to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a circuit part;
first and second connection pads; and
a trimmable resistor trimmable by Joule effect, the trimmable resistor having:
first and second connection terminals electrically coupled to the circuit part, at least one of the first and second connection terminals being configured to be electrically coupled in a trimming phase to the first connection pad;
an intermediate terminal electrically coupled to the second connection pad; and
first and second resistor portions, the first resistor portion positioned between the first connection terminal and the intermediate terminal and the second resistor portion positioned between the second connection terminal and the intermediate terminal, the first and second connection pads being configured to receive a substantially zero voltage drop between the first and the second connection terminals and the intermediate terminal being configured to receive an electrical quantity able to generate in the first and second resistor portions respective trimming current flows that modify an electric characteristic of the trimmable resistor.

2. The circuit of claim 1, comprising a trimming circuit having:
an electrical quantity source coupled to the intermediate terminal of the trimmable resistor; and
a connection circuit configured to electrically couple the first and second connection terminals to each other;
the trimming circuit being configured to generate respective trimming current flows that modify the electric characteristic of the trimmable resistor while maintaining the substantially zero voltage drop between the first and the second connection terminals.

3. The circuit according to claim 2, wherein the electrical characteristic is one of electrical resistance and temperature coefficient and the trimming circuit is configured to cause the current flows to modify the resistance or the temperature coefficient of the trimmable resistor.

4. The circuit according to claim 2, wherein the electrical quantity source is a voltage source.

5. The circuit according to claim 2, wherein the electrical quantity source is configured to apply current pulses to the intermediate terminal.

6. The circuit according to claim 2, wherein the trimming circuit comprises:
a resistance measure circuit configured to measure a resistance of the trimmable resistor and provide a resistance measurement signal; and
a control unit configured to control the electrical quantity source based on the resistance measurement signal.

7. The circuit according to claim 6, wherein:
the electrical quantity source has a first terminal, electrically coupled to the intermediate terminal, and a second terminal; and
the resistance measure circuit includes:
a first current gauge electrically coupled between the first connection terminal and the second terminal of the electrical quantity source; and
a second current gauge electrically coupled between the second connection terminal and the second terminal of the electrical quantity source.

8. The circuit according to claim 1, further comprising a first and a second switch series-coupled between the first and the second connection terminals of the trimmable resistor.

9. The circuit according to claim 8, wherein the first and the second switches respectively are first and second transistors having respective first and second terminals and a control terminal, the first terminal of the first transistor being coupled to the first connection terminal of the trimmable resistor, the first terminal of the second transistor being coupled to the second connection terminal of the trimmable resistor, the second terminals of the first and the second transistors being coupled to each other and to the first connection pad and the control terminals of the first and the second transistors being coupled to each other, the first and second transistors being configured to be on during the trimming phase and off during an operating phase of the integrated circuit.

10. The circuit according to claim 9, further comprising a third connection pad electrically coupled to the control terminals of the first and second transistors, the first and third connection pads being configured to be biased so as to turn on the first and the second transistors during the trimming phase and turn off the first and the second transistors during the operating phase of the integrated circuit.

11. The circuit according to claim 1, wherein the trimmable resistor has a structure selected from among: linear, zigzag and spiral-like.

12. The circuit according to claim 1, further comprises a third connection pad, wherein the first and second connection pads are directly connected to the first and second connection terminals.

13. The circuit according to claim 1, wherein the trimmable resistor is configured to generate, in response to the electrical quantity, the trimming current flows that both enter the intermediate terminal.

14. The circuit according to claim 1, wherein the trimmable resistor is configured to generate, in response to the electrical quantity, the trimming current flows that both exit the intermediate terminal.

15. A trimming method, comprising:
applying a substantially zero voltage drop between first and second connection terminals of a trimmable resistor;
simultaneously with applying the substantially zero voltage drop, applying a non-zero electrical quantity to an intermediate terminal that divides the trimmable resistor into first and second resistor portions; and
generating a first trimming current flow in the first resistor portion and a second trimming current flow in the second resistor portion, the first and second current flows causing a change in an electrical characteristic of the trimmable resistor.

16. The trimming method according to claim 15, wherein the electrical quantity is a voltage.

17. The trimming method according to claim 15, wherein the electrical characteristic of the trimmable resistor is one of electric resistance and temperature coefficient.

18. The trimming method according to claim 15, further comprising interrupting applying the electrical quantity, measuring a change in the electrical characteristic of the trimmable resistor, and repeating applying the electrical quantity.

19. The trimming method according to claim 15, wherein measuring the change in the electrical characteristic of the trimmable resistor comprises:
before performing applying the substantially zero voltage drop and applying the non-zero electrical quantity:
biasing an integrated circuit that includes a circuit part and the trimmable resistor;
measuring an electrical quantity of the integrated circuit;
disconnecting the integrated circuit from a supply source; and
after applying the substantially zero voltage drop, applying the non-zero electrical quantity, and generating the first and second trimming current flows, repeating the biasing and measuring the electrical quantity of the integrated circuit, followed again by applying a zero voltage drop, the applying a non-zero electrical quantity, and the generating a first and a second trimming current flows until reaching a desired value for said electrical quantity of the integrated circuit.

20. The trimming method according to claim 15, wherein the first and second current flows both enter the intermediate terminal.

21. The trimming method according to claim 15, wherein the first and second current flows both exit the intermediate terminal.

22. A method, comprising:
permanently changing an electrical characteristic of a trimmable resistor using heat, the permanently changing including:
short circuiting first and second connection terminals of the trimmable resistor; and
applying an electrical quantity to an intermediate terminal of the trimmable resistor, the applying including forming a first current flow in a first resistor portion of the trimmable resistor extending between the intermediate terminal and the first connection terminal and a second current flow in a second portion of the resistor extending between the intermediate terminal and the second end of the resistor.

23. The method of claim 22, wherein the electrical characteristic is resistance, and applying the electrical quantity includes applying a trimming voltage, the method further comprising:
during applying the trimming voltage, measuring the first and second current flows;
determining a resistance value of the trimmable resistor based on the trimming voltage and the measured current flows; and
ending applying the trimming voltage in response to determining that the resistance value is within an acceptable range.

24. The method of claim 22, comprising:
after applying the electrical quantity, measuring a value of the electrical characteristic of the trimmable resistor; and
if the measured value of the electrical characteristic is outside of an acceptable range, repeating applying the electrical quantity followed by repeating measuring the value of the electrical characteristic of the trimmable resistor, until the measured value is within the acceptable range.

25. The method of claim 22, wherein:
the first and second connection terminals are respectively electrically coupled to first and second connection pads of an integrated circuit that includes the trimmable resistor and a circuit part configured to be trimmed by the trimmable resistor;
the short circuiting includes electrically coupling first and second terminals of a trimming circuit to the first and second connection pads, respectively, the first and second terminals of the trimming circuit being short circuited within the trimmable device; and
the applying includes applying the electrical quantity using an electrical quantity source within the trimming circuit.

26. The method of claim 22, wherein the short circuiting includes:
closing a first switch electrically coupled between the first connection terminal of the trimmable resistor and a connection pad of an integrated circuit that includes the timmable resistor and a circuit part configured to be trimmed by the trimmable resistor; and
while closing the first switch, closing a second switch electrically coupled between the second connection terminal of the resistor and the connection pad.

27. A circuit, comprising,
a semiconductor substrate;
an integrated circuit formed on the semiconductor substrate;
a resistor formed on the substrate and configured to be trimmable by joule effect, the resistor having first and second connection terminals and an intermediate terminal, the first and second connection terminals being electrically coupled to respective nodes of the integrated circuit, the intermediate terminal positioned between the first and second connection terminals and dividing the resistor into first and second resistor portions; and
a trimming circuit configured to modify an electrical characteristic of the resistor by generating a first trimming current flow through the first resistor portion and a second trimming current flow through the second resistor portion while maintaining a substantially zero voltage drop between the first and the second connection terminals.

28. The circuit of claim 27, comprising:
first and second connection pads electrically coupled to the first and second connection terminals, respectively, pad electrically coupled to the intermediate terminal of the resistor; and
a second connection pad electrically coupled to the first connection terminals, wherein the trimming circuit is electrically coupled to first and second connection pads.

29. The circuit of claim 28, comprising:
- a first transistor having a first conduction terminal coupled to the first connection terminal of the resistor, a second conduction terminal coupled to the second connection pad, and a control terminal; and
- a second transistor having a first conduction terminal coupled to the second connection terminal of the resistor, a second conduction terminal coupled to the second connection pad, and a control terminal coupled to the control terminal of the first transistor.

30. The circuit of claim 27, comprising:
- a first connection pad electrically coupled to the first connection terminal of the resistor;
- a second connection pad electrically coupled to the second connection terminal of the resistor; and
- a third connection pad electrically coupled to the intermediate terminal of the resistor, wherein the trimming circuit is coupled to the connection pads.

\* \* \* \* \*